(12) United States Patent
Huang

(10) Patent No.: US 12,295,150 B2
(45) Date of Patent: May 6, 2025

(54) SEMICONDUCTOR DEVICE WITH RING-SHAPED ELECTRODE AND METHOD FOR PREPARING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 466 days.

(21) Appl. No.: 17/849,768

(22) Filed: Jun. 27, 2022

(65) Prior Publication Data

US 2023/0420488 A1    Dec. 28, 2023

(51) Int. Cl.
*H10D 1/68*    (2025.01)

(52) U.S. Cl.
CPC .................... *H10D 1/692* (2025.01)

(58) Field of Classification Search
CPC ........ H10D 1/692; H10D 1/696; H10D 1/711; H10D 1/712; H10D 1/714; H10D 1/716; H10D 1/694; H01L 28/40; H01L 28/60; H01L 28/75; H01L 28/82–91; H01G 11/26; H01G 4/005
USPC ....................................................... 257/308
See application file for complete search history.

(56) References Cited

U.S. PATENT DOCUMENTS

2006/0289915 A1    12/2006    Omura et al.
2013/0181326 A1*    7/2013    Cheng ............... H01L 28/91
                                                        438/387

FOREIGN PATENT DOCUMENTS

TW    200729456 A    8/2007
TW    I596773 B    8/2017
TW    I748199 B    12/2021

OTHER PUBLICATIONS

Office Action dated on Sep. 6, 2023 related to Taiwanese Application No. 111145298.

* cited by examiner

*Primary Examiner* — Julio J Maldonado
*Assistant Examiner* — Nathan Pridemore
(74) *Attorney, Agent, or Firm* — Xuan Zhang

(57) ABSTRACT

A semiconductor device includes a bottom electrode structure disposed over a semiconductor substrate. The bottom electrode structure includes a first bottom electrode layer, and a second bottom electrode layer surrounding the first bottom electrode layer. The semiconductor device also includes a plurality of insulating portions laterally separating the first bottom electrode layer and the second first bottom electrode layer. The semiconductor device further includes a top electrode disposed over and surrounded by the bottom electrode to structure. The top electrode has a ring shape from a top view. In addition, the semiconductor device includes an insulating layer separating the top electrode from the bottom electrode structure.

11 Claims, 21 Drawing Sheets

SEMICONDUCTOR DEVICE WITH RING-SHAPED ELECTRODE AND METHOD FOR PREPARING THE SAME

TECHNICAL FIELD

The present disclosure relates to a semiconductor device and a method for preparing the same, and more particularly, to a semiconductor device with a ring-shaped electrode and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a bottom electrode structure disposed over a semiconductor substrate. The bottom electrode structure includes a first bottom electrode layer, and a second bottom electrode layer surrounding the first bottom electrode layer. The semiconductor device also includes a plurality of insulating portions laterally separating the first bottom electrode layer and the second first bottom electrode layer. The semiconductor device further includes a top electrode disposed over and surrounded by the bottom electrode structure. The top electrode has a ring shape from a top view. In addition, the semiconductor device includes an insulating layer separating the top electrode from the bottom electrode structure.

In an embodiment, the first bottom electrode layer and the second bottom electrode layer include different materials. In an embodiment, the first bottom electrode layer extends over a top surface of the second bottom electrode layer. In an embodiment, the insulating layer extends over a top surface of the second bottom electrode layer. In an embodiment, the insulating portions include an inner insulating portion and an outer insulating portion separating from the inner insulating portion, and the top electrode is disposed between the inner insulating portion and the outer insulating portion. In an embodiment, the inner insulating portion and the outer insulating portion are ring-shaped. In an embodiment, the semiconductor device further includes a dielectric layer disposed between the bottom electrode structure and the semiconductor substrate, wherein the first bottom electrode layer and the second bottom electrode layer are in direct contact with the dielectric layer.

In another embodiment of the present disclosure, a semiconductor device is provided. The semiconductor device includes a top electrode disposed over a semiconductor substrate. The top electrode has a ring shape from a top view. The semiconductor device also includes an insulating layer disposed along an inner sidewall, a bottom surface, and an outer sidewall of the top electrode, and a bottom electrode structure surrounding the insulating layer. The bottom electrode structure includes a first bottom electrode layer directly contacting the insulating layer, and a second bottom electrode layer surrounding the first bottom electrode layer. The semiconductor device further includes a plurality of insulating portions disposed between the first bottom electrode layer and the second bottom electrode layer.

In an embodiment, the first bottom electrode layer extends between the insulating layer and the semiconductor substrate. In an embodiment, the first bottom electrode layer includes titanium nitride (TiN), and the second bottom electrode layer includes polysilicon, silicon germanium (SiGe), or a combination thereof. In an embodiment, the first bottom electrode layer extends over and in direct contact with a top surface of the second bottom electrode layer and top surfaces of the insulating portions. In an embodiment, the insulating layer includes a first insulating material, and the insulating portions include a second insulating material, and wherein the first insulating material is different from the second insulating material. In an embodiment, the semiconductor device further includes a dielectric layer disposed between the bottom electrode structure and the semiconductor substrate, wherein the first bottom electrode layer, the second bottom electrode layer and the insulating portions are in direct contact with the dielectric layer.

In yet another embodiment of the present disclosure, a method for preparing a semiconductor device is provided. The method includes forming a dielectric layer over a semiconductor substrate, and forming an energy removable layer over the dielectric layer. The method also includes etching the energy removable layer to form a ring-shaped opening exposing the dielectric layer, and depositing a first bottom electrode layer along an inner sidewall, a bottom surface, and an outer sidewall of the ring-shaped opening. The method further includes depositing an insulating layer over the first bottom electrode layer, and forming a top electrode in a remaining portion of the ring-shaped opening. In addition, the method includes removing the energy removable layer after the top electrode is formed.

In an embodiment, the first bottom electrode layer extends over a top surface of the energy removable layer. In an embodiment, the insulating layer extends over a top surface of the energy removable layer. In an embodiment, the formation of the top electrode includes depositing a top electrode material over the insulating layer, and performing a planarization process on the top electrode material to expose a portion of the insulating layer over a top surface of the energy removable layer. In an embodiment, the method further includes depositing an insulating material covering a top surface of the dielectric layer, sidewalls of the first bottom electrode layer, and a top surface of the top electrode after the energy removable layer is removed, and performing an etch-back process on the insulating material such that an inner insulating portion and an outer insulating portion remain on the sidewalls of the first bottom electrode layer. In an embodiment, the inner insulating portion and the outer insulating portion are ring-shaped, and the top electrode is located between the inner insulating portion and the outer insulating portion. In an embodiment, the method further includes depositing a second bottom electrode layer between the first bottom electrode layer and the dielectric layer after the inner insulating portion and the outer insulating portion are formed, wherein the second bottom electrode layer includes an inner portion surrounded by the inner insulating portion and an outer portion surrounding the outer insulating portion.

Embodiments of a semiconductor device and method for preparing the same are provided in the disclosure. In some embodiments, the semiconductor device includes a bottom electrode structure, a top electrode disposed over the bottom electrode structure, and an insulating layer separating the top electrode from the bottom electrode structure. In some embodiments, the bottom electrode structure includes a first bottom electrode layer and a second bottom electrode layer surrounding the first bottom electrode layer. The top electrode has a ring shape, and the top electrode is surrounded by the first bottom electrode layer. Before the second bottom electrode layer is formed, the top electrode, the insulating layer and the first bottom electrode layer collectively form a pillar-like structure for enhancing structural strength, which makes the structure not likely to collapse. In addition, the first bottom electrode layer and the second bottom electrode layer are laterally separated by a plurality of insulating portions, thereby increasing the surface area of the electrode plates, and hence, the effective capacitance can be obtained. As a result, the overall device performance may be improved, and the yield rate of the semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
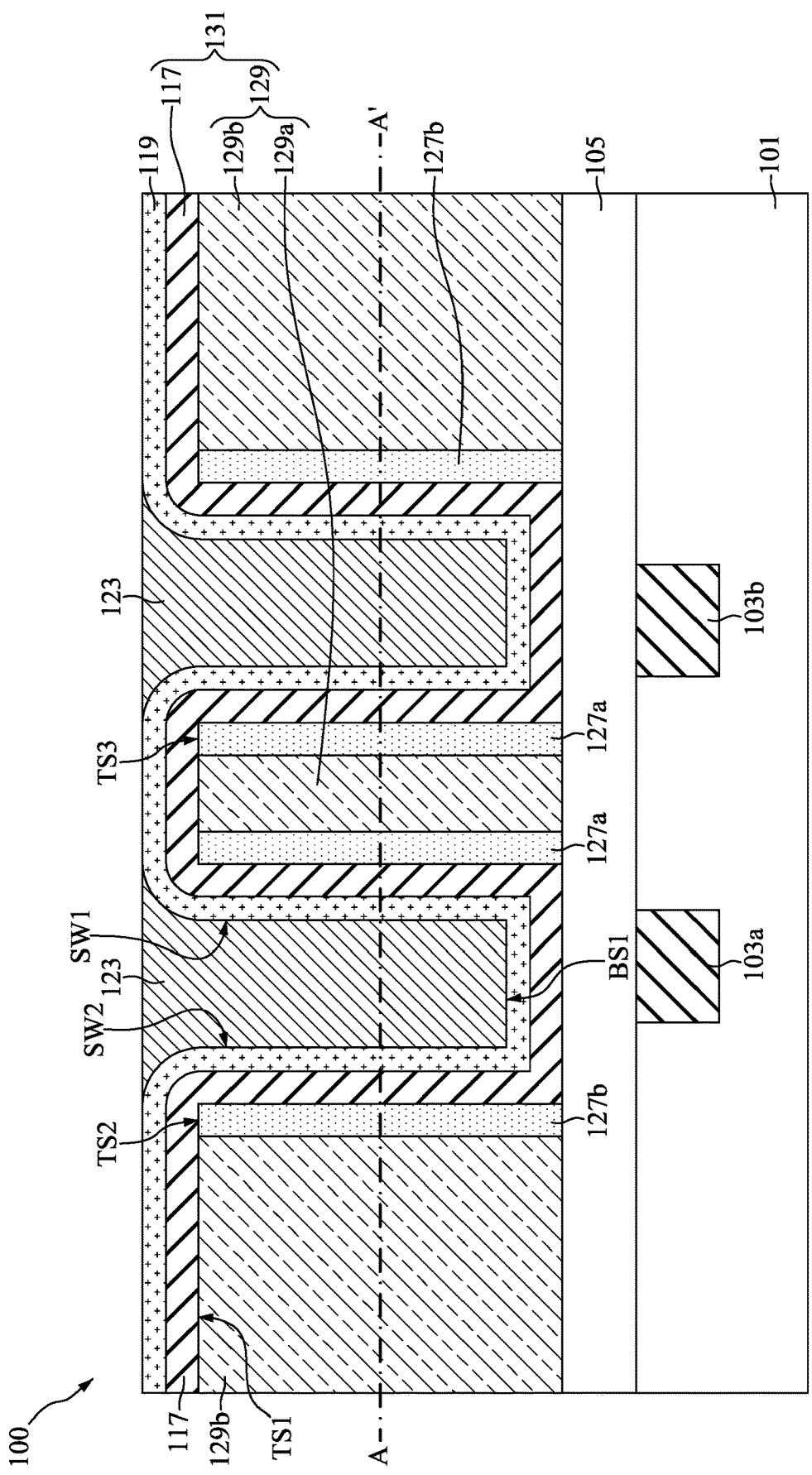
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
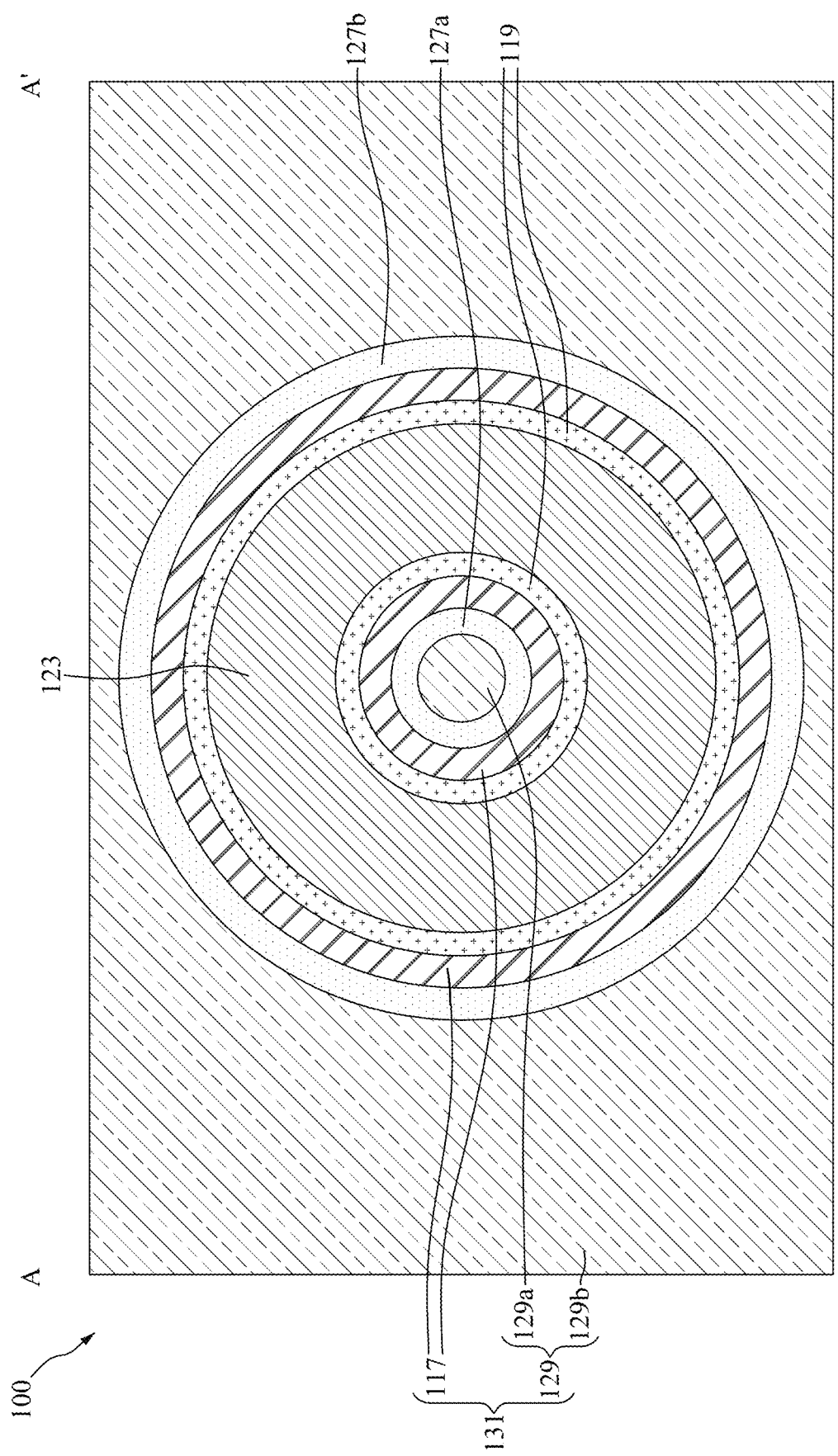
FIG. 2 is a cross-sectional view taken along line A-A' in FIG. 1, in accordance with some embodiments.

FIG. 1 is a cross-sectional view illustrating a semiconductor device 100, and FIG. 2 is a cross-sectional view taken along line A-A' in FIG. 1, in accordance with some embodiments. In some embodiments, the semiconductor device 100 includes a semiconductor substrate 101, a plurality of conductive contacts 103a and 103b disposed in the semiconductor substrate 101, and a dielectric layer 105 disposed over the semiconductor substrate 101. In some embodiments, the semiconductor device 100 includes a capacitor disposed over the dielectric layer 105.

In some embodiments, the capacitor of the semiconductor device 100 includes a bottom electrode structure 131, a plurality of insulating portions 127a and 127b disposed in the bottom electrode structure 131, a top electrode 123 disposed over and surrounded by the bottom electrode structure 131, and an insulating layer 119 separating the top electrode 123 and the bottom electrode structure 131. In some embodiments, the bottom electrode structure 131 includes a first bottom electrode layer 117 and a second bottom electrode layer 129 surrounding the first bottom electrode layer 117, and the second bottom electrode layer 129 includes an inner portion 129a and an outer portion 129b. In some embodiments, the second bottom electrode layer 129 is laterally separated from the first bottom electrode layer 117 by the insulating portions 127a and 127b.

In some embodiments, the top electrode 123 has a ring shape, as shown in the cross-sectional view of FIG. 2. In some embodiments, the top electrode 123 has a ring shape from a top view. In some embodiments, the insulating portion 127a (also referred to as an inner insulating portion) and the insulating portion 127b (also referred to as an outer insulating portion) are separated (i.e., not physically connected). In some embodiments, the insulating portions 127a and 127b are ring-shaped as shown in the cross-sectional view of FIG. 2. In some embodiments, the insulating portions 127a and 127b have ring shapes from a top view.

Moreover, in some embodiments, the top electrode 123 is disposed between the inner insulating portion 127a and the outer insulating portion 127b. In some embodiments, the inner portion 129a of the second bottom electrode layer 129 is surrounded by and in direct contact with the inner insulating portion 127a. In some embodiments, the outer insulating portion 127b is surrounded by and in direct contact with the outer portion 129b of the second bottom electrode layer 129.

In some embodiments, the first bottom electrode layer 117 and the second bottom electrode layer 129 include different materials. For example, the first bottom electrode layer 117 includes titanium nitride (TiN), and the second bottom electrode layer 129 includes polysilicon, silicon germanium (SiGe), or a combination thereof, in accordance with some embodiments. Moreover, in some embodiments, the insulating layer 119 includes a first insulating material, and the insulating portions 127a and 127b include a second insulating material, and the first insulating material is different from the second insulating material.

In some embodiments, the first bottom electrode layer 117 extends over a top surface TS1 of the second bottom electrode layer 129. In some embodiments, the insulating layer 119 extends over the top surface TS1 of the second bottom electrode layer 129, and the portion of the first bottom electrode layer 117 over the top surface TS1 of the second bottom electrode layer 129 is covered by the insulating layer 119. In some embodiments, the first bottom electrode layer 117 is in direct contact with the top surface TS1 of the second bottom electrode layer 129 and the top surfaces TS2 and TS3 of the insulating portions 127a and 127b.

In some embodiments, the top electrode 123 has an inner sidewall SW1 (i.e., an inner periphery or an inner edge) and an outer sidewall SW2 (i.e., an outer periphery or an outer edge), the insulating layer 119 is disposed along (or covering) the inner sidewall SW1, the outer sidewall SW2, and a bottom surface BS1 of the top electrode 123. In some embodiments, the first bottom electrode layer 117 and the second bottom electrode layer 129 are in direct contact with the dielectric layer 105. In some embodiments, the inner insulating portion 127a and the outer insulating portion 127b are in direct contact with the dielectric layer 105.

In some embodiments, the semiconductor device 100 is part of dynamic random access memory (DRAM), and the top electrode 123, the insulating layer 119, the bottom electrode structure 129, and the insulating portions 127a and 127b form a capacitor in the DRAM. In some embodiments, the capacitor is a metal-insulator-metal (MIM) capacitor. In some embodiments, the capacitor is electrically connected to the conductive contacts 103a and 103b disposed in the semiconductor substrate 101.

Since the first bottom electrode layer 117 and the second bottom electrode layer 129 of the bottom electrode structure 131 are laterally separated by the insulating portions 127a and 127b, the surface area of the electrode plates is increased, and the effective capacitance can be obtained. As a result, the overall device performance may be improved.

Figure 3:
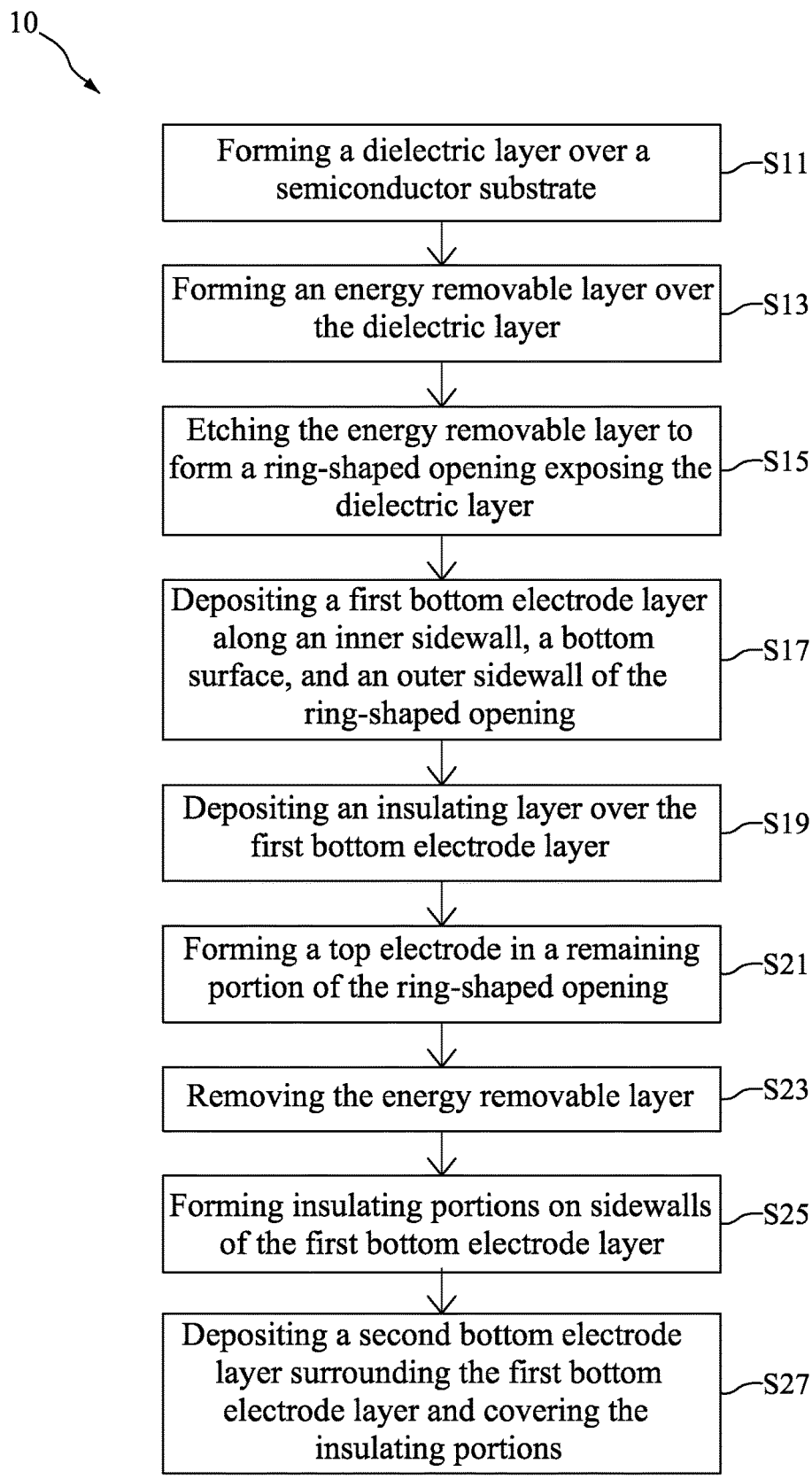
FIG. 3 is a flow diagram illustrating a method for preparing a semiconductor device, in accordance with some embodiments.

FIG. 3 is a flow diagram illustrating a method 10 for preparing a semiconductor device (e.g., the semiconductor device 100), and the method 10 includes steps S11, S13, S15, S17, S19, S21, S23, S25 and S27, in accordance with some embodiments. The steps S11 to S27 of FIG. 3 are elaborated in connection with the following figures.

Figure 4:
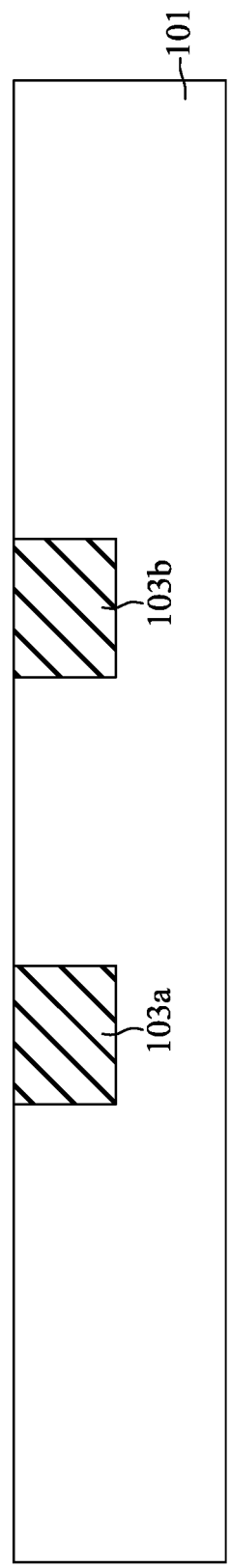
FIG. 4 is a cross-sectional view illustrating an intermediate stage of forming conductive contacts in a semiconductor substrate during the formation of the semiconductor device, in accordance with some embodiments.
Figure 7:
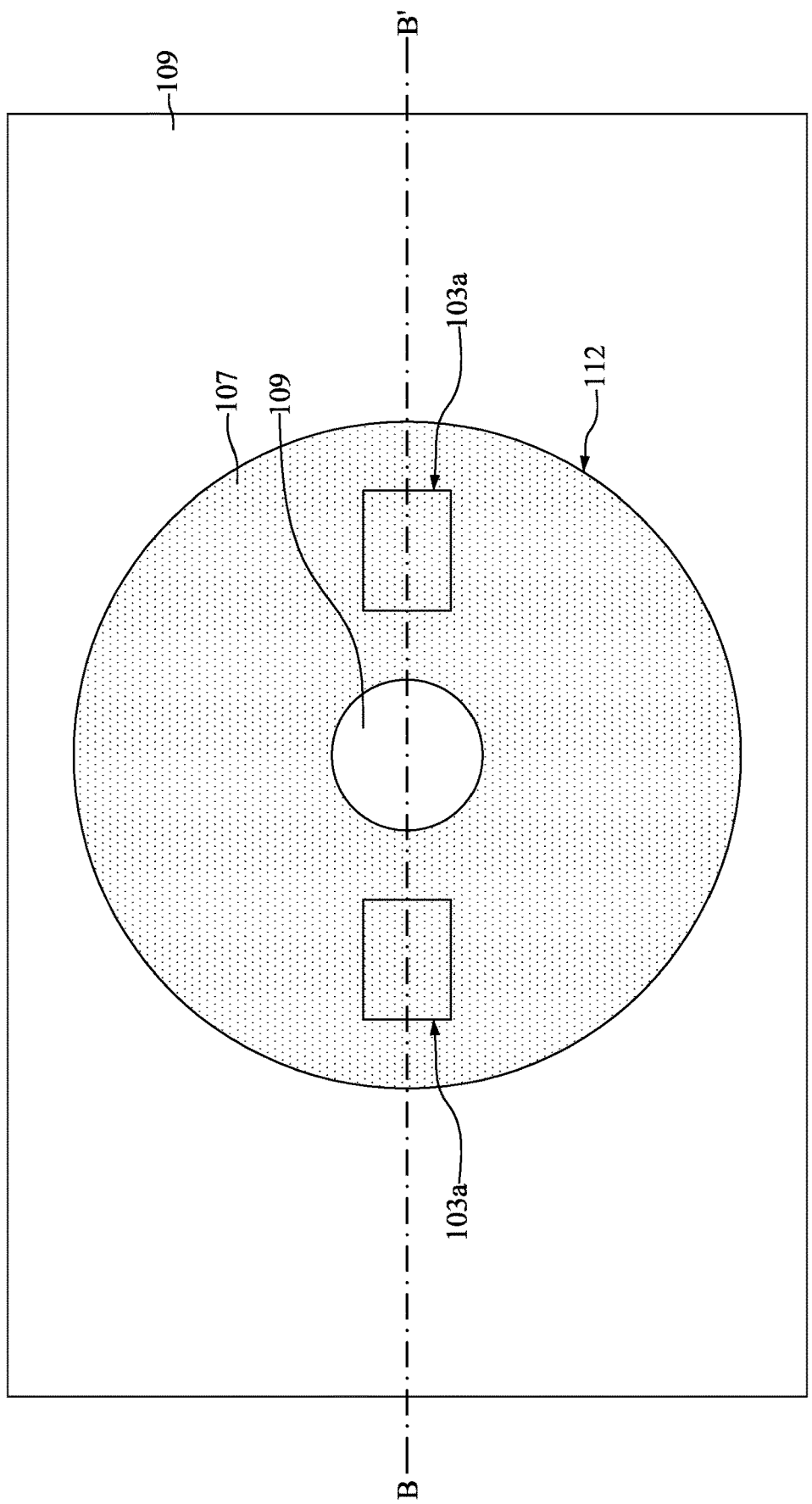
FIG. 7 is a top view illustrating an intermediate stage of forming a patterned hard mask with a ring-shaped opening over the energy removable layer during the formation of the semiconductor device, in accordance with some embodiments.
Figure 8:
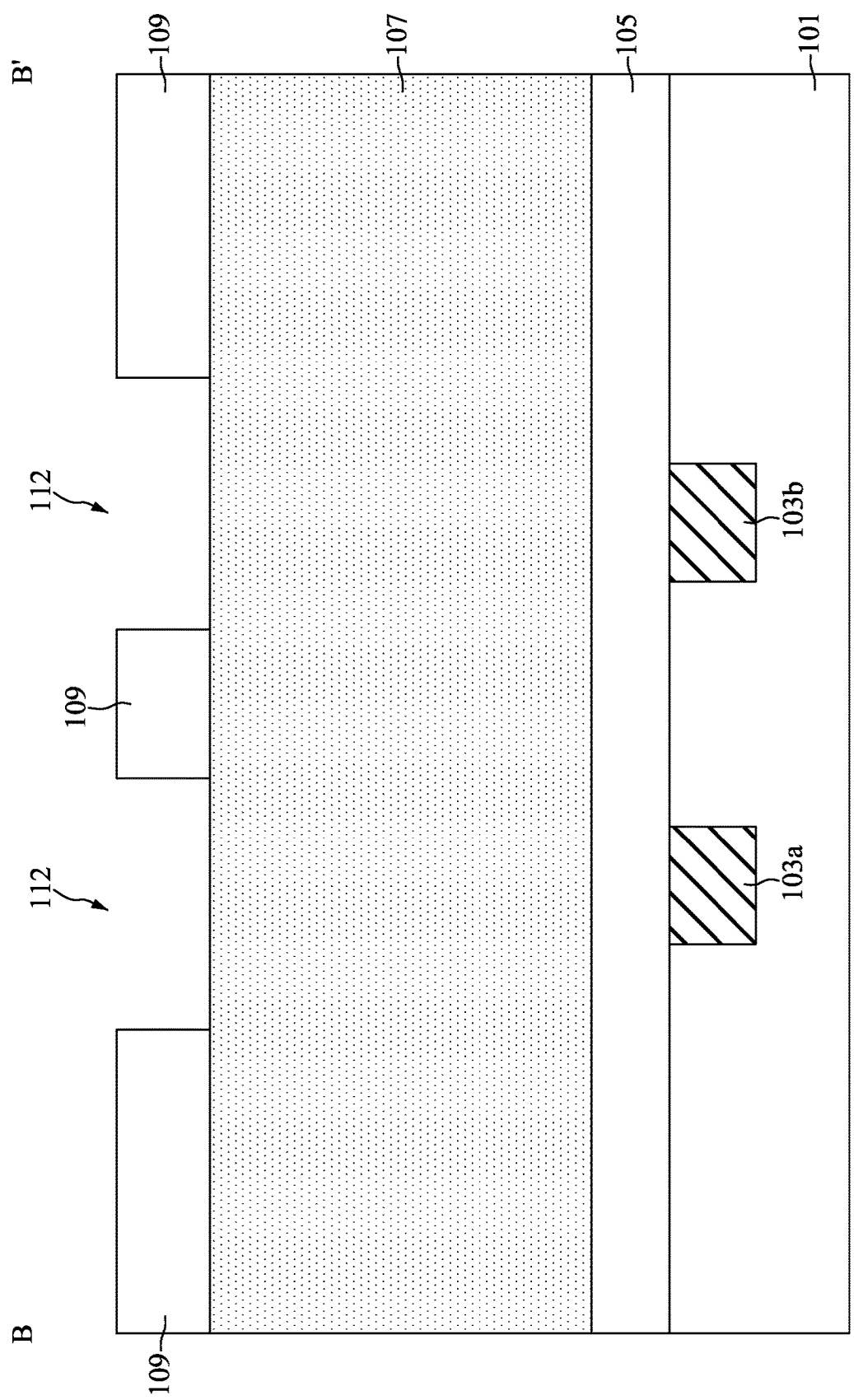
FIG. 8 is a cross-sectional view taken along line B-B' in FIG. 7, in accordance with some embodiments.

FIGS. 4-6, 8-10, 12-15, 17 and 19-20 are cross-sectional views illustrating intermediate stages in the formation of the semiconductor device 100, in accordance with some embodiments. FIG. 7 is a top view of FIG. 8, and FIG. 8 is a cross-sectional view taken along line B-B' in FIG. 7. FIGS. 11, 16. 18 and 21 are cross-sectional views taken along line A-A' in FIGS. 10, 15, 17 and 20, respectively. As shown in FIG. 4, a semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Moreover, in some embodiments, a plurality of source/drain regions (not shown) are formed in the semiconductor substrate 101.

A plurality of conductive contacts 103a and 103b are formed in the semiconductor substrate 101, as shown in FIG. 4 in accordance with some embodiments. In some embodiments, the conductive contacts 103a and 103b include copper (Cu), tungsten (W), aluminum (Al), titanium (Ti), tantalum (Ta), gold (Au), silver (Ag), a combination thereof, or another suitable conductive material. In some embodiments, the conductive contacts 103a and 103b are formed by an etching process, a deposition process, and a planarization process.

For example, the conductive contacts 103a and 103b are formed by etching the semiconductor substrate 101 to form a plurality of openings (not shown), depositing a conductive material (not shown) in the openings and over the top surface of the semiconductor substrate 101, and performing a planarization process on the conductive material to remove excess portions of the conductive material over the top surface of the semiconductor substrate 101. The etching process may include a wet etching process, a dry etching process, or a combination thereof. The deposition process may include a chemical vapor deposition (CVD) process, a physical vapor deposition (PVD) process, an atomic layer deposition (ALD) process, a spin-on coating process, or another suitable method. The planarization process may include a chemical mechanical polishing (CMP) process.

Figure 5:
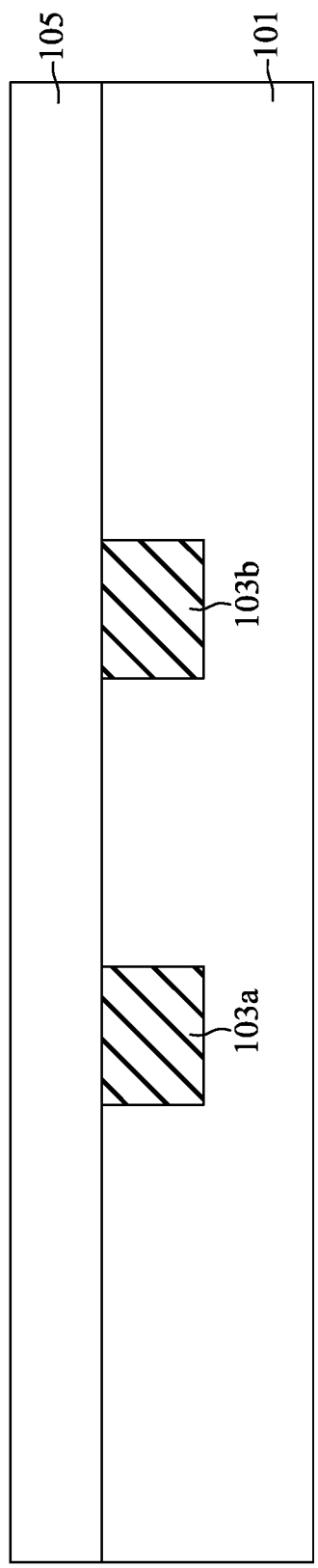
FIG. 5 is a cross-sectional view illustrating an intermediate stage of forming a dielectric layer over the semiconductor substrate during the formation of the semiconductor device, in accordance with some embodiments.

Next, a dielectric layer 105 is formed over the semiconductor substrate 101, and the conductive contacts 103a and 103b are covered by the dielectric layer 105, as shown in FIG. 5 in accordance with some embodiments. The respective step is illustrated as the step S11 in the method 10 shown in FIG. 3. In some embodiments, the dielectric layer 105 includes a dielectric material, such as silicon oxide, silicon nitride, silicon oxynitride, or another suitable dielectric material. In some embodiments, the dielectric layer 105 is formed by a deposition process, such as a CVD process, a PVD process, an ALD process, a spin-on coating process, or another suitable method.

Figure 6:
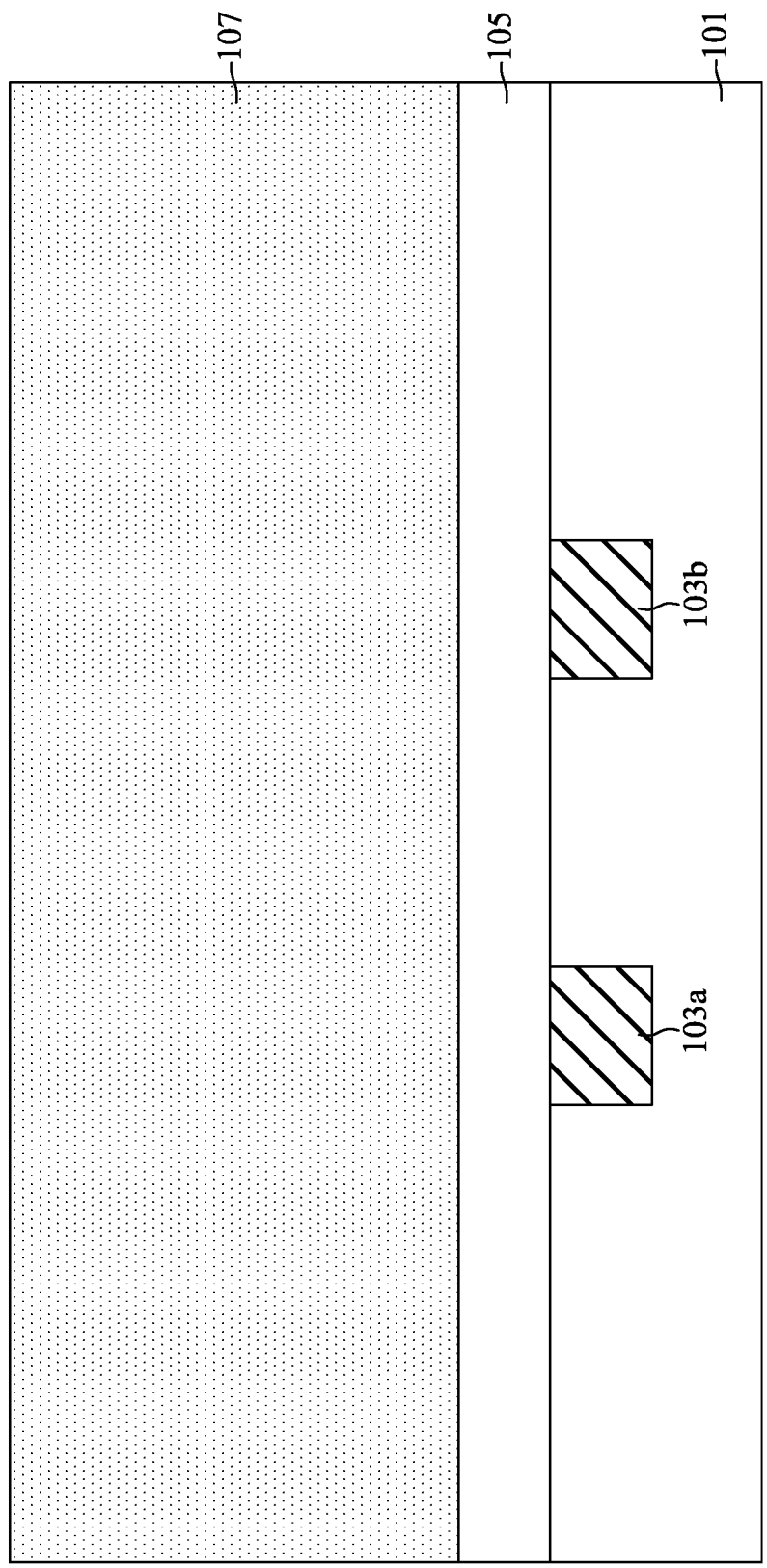
FIG. 6 is a cross-sectional view illustrating an intermediate stage of forming an energy removable layer over the dielectric layer during the formation of the semiconductor device, in accordance with some embodiments.

Subsequently, an energy removable layer 107 is formed over the dielectric layer 105, as shown in FIG. 6 in accordance with some embodiments. The respective step is illustrated as the step S13 in the method 10 shown in FIG. 3. In some embodiments, the energy removable layer 107 includes a cross-linking compound having a cross-linking functional group. In some embodiments, the cross-linking functional group includes a double bond. In some embodiments, the cross-linking compound has a hydrogen-bonding group, a polymerizable diacetylene group, or a combination thereof. In some embodiments, the energy removable layer 107 is formed by a deposition process, such as a CVD process, a PVD process, an ALD process, a spin-on coating process, or a combination thereof.

Then, a patterned hard mask 109 with a ring-shaped opening 112 is formed over the energy removable layer 107, as shown in FIGS. 7 and 8 in accordance with some embodiments. In some embodiments, the patterned hard mask 109 is formed by a deposition process, such as a CVD process, a PVD process, an ALD process, a spin-on coating process, or a combination thereof. In some embodiments, the patterned hard mask 109 and the energy removable layer 107 include different materials so that the etching selectivities may be different in the subsequent etching process.

Figure 9:
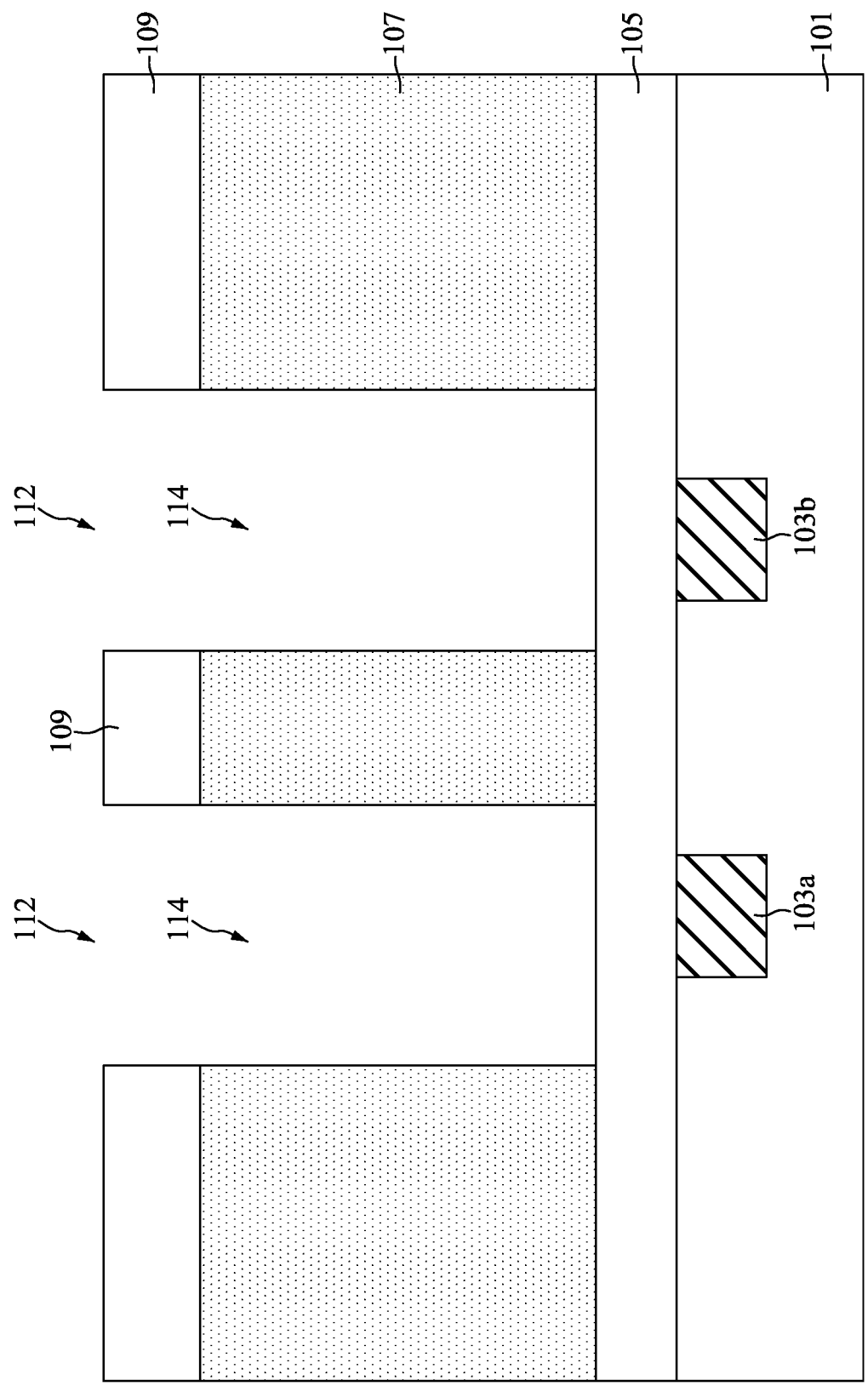
FIG. 9 is a cross-sectional view illustrating an intermediate stage of etching the energy removable layer to form a ring-shaped opening exposing the dielectric layer during the formation of the semiconductor device, in accordance with some embodiments.

Next, an etching process is performed on the energy removable layer 107 using the patterned hard mask 109 as a mask, such that a ring-shaped opening 114 is formed in the energy removable layer 107, as shown in FIG. 9 in accordance with some embodiments. In some embodiments, the ring-shaped opening 114 penetrates through the energy removable layer 107, such that the dielectric layer 105 is partially exposed by the ring-shaped opening 114. The respective step is illustrated as the step S15 in the method 10 shown in FIG. 3. The etching process may be a wet etching process, a dry etching process, or a combination thereof.

Figure 10:
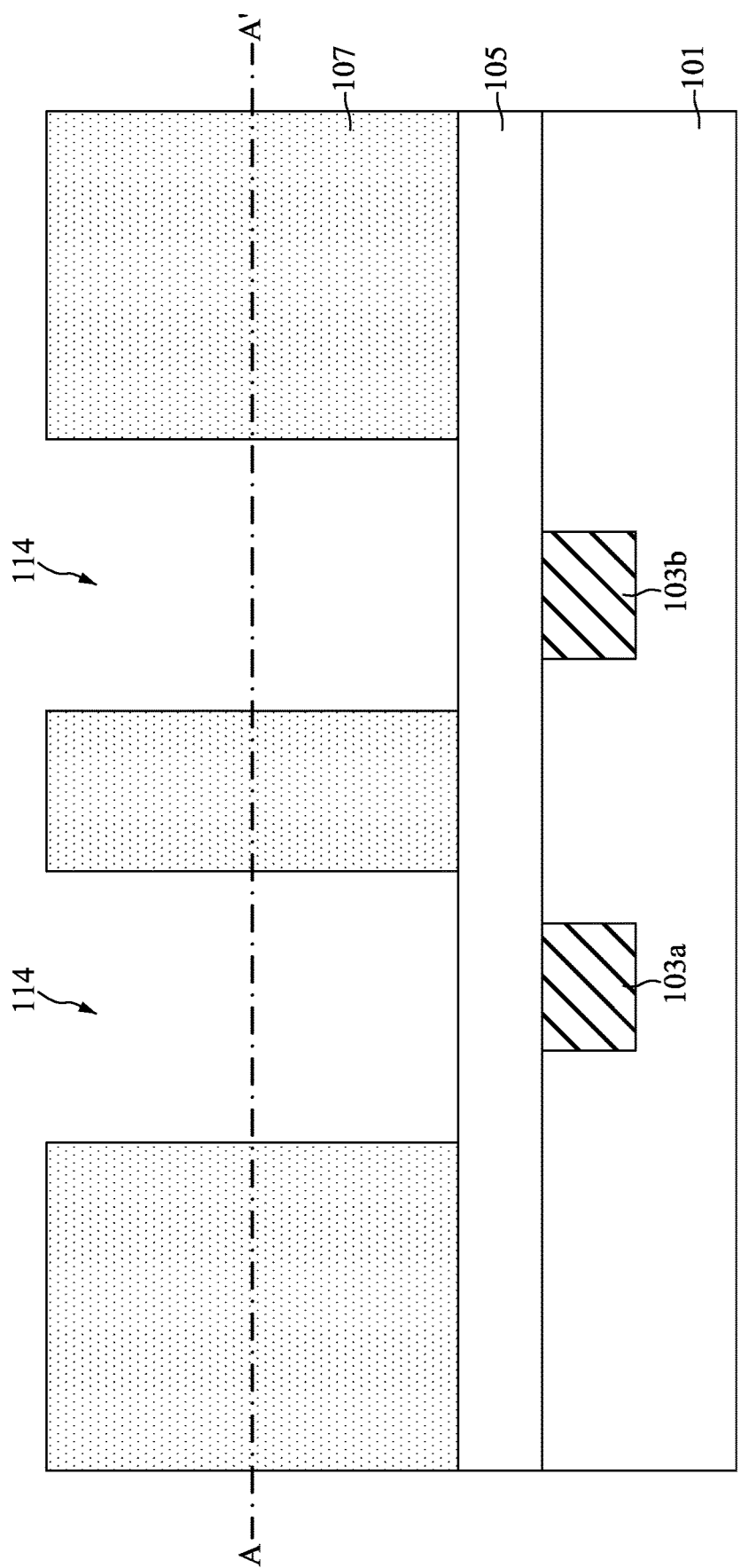
FIG. 10 is a cross-sectional view illustrating an intermediate stage of removing the patterned mask during the formation of the semiconductor device, in accordance with some embodiments.
Figure 11:
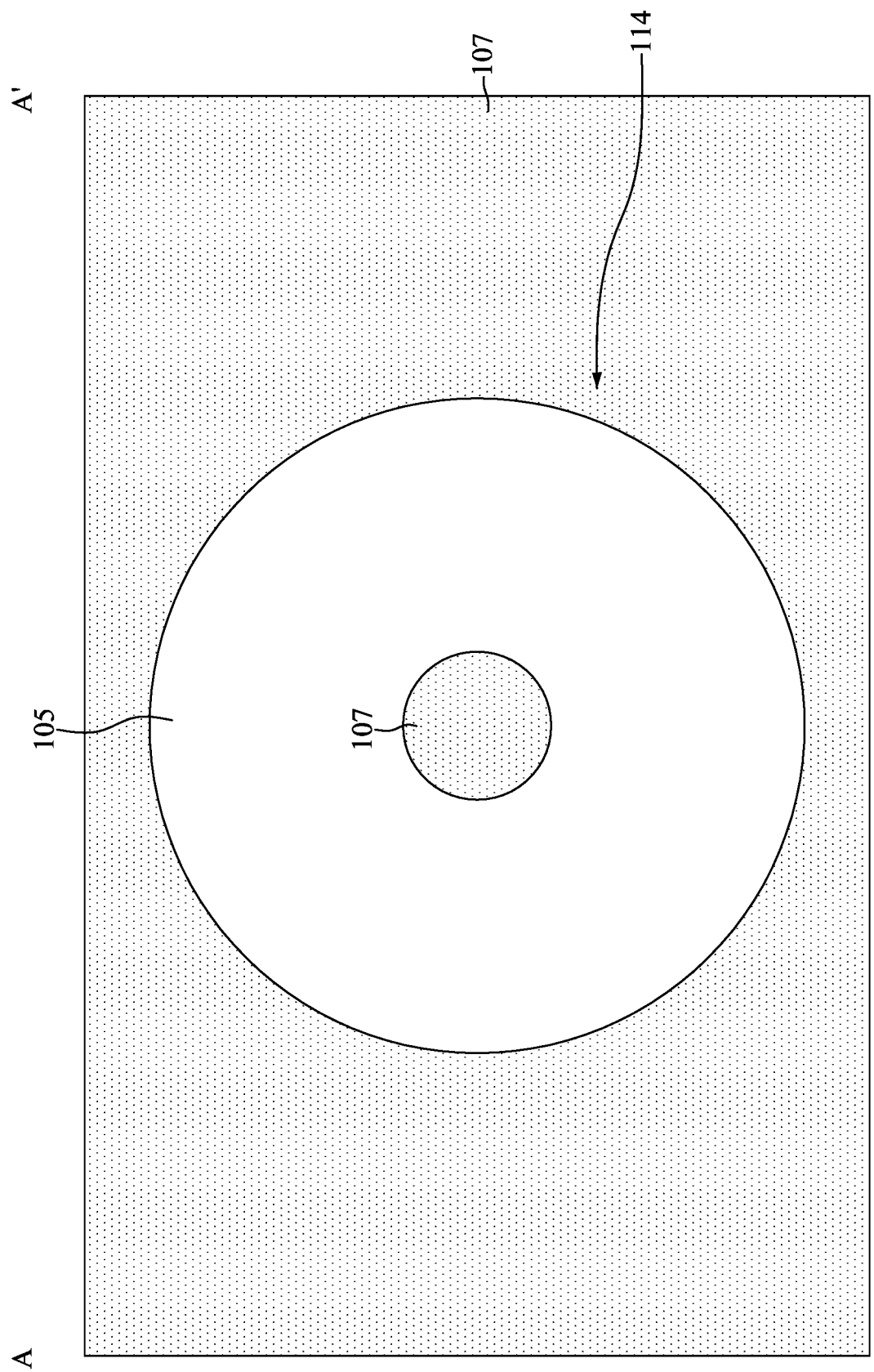
FIG. 11 is a cross-sectional view taken along line A-A' in FIG. in accordance with some embodiments.

After the ring-shaped opening 114 is formed, the patterned hard mask 109 may be removed, as shown in FIGS. 10 and 11 in accordance with some embodiments. In some embodiments, the patterned hard mask 109 is removed by a stripping process, an ashing process, an etching process, or another suitable process.

Figure 12:
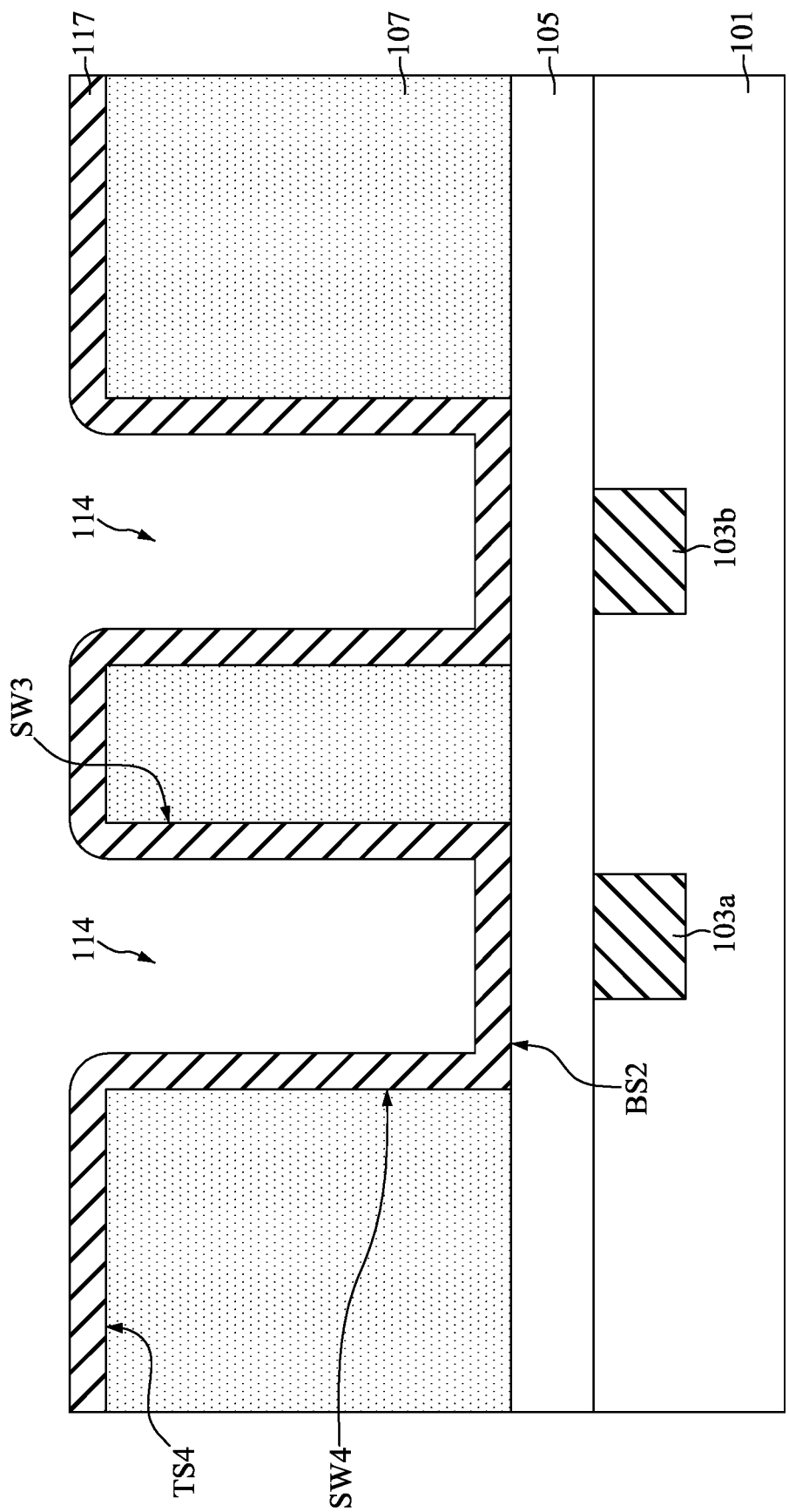
FIG. 12 is a cross-sectional view illustrating an intermediate stage of depositing a first bottom electrode layer along an inner sidewall, a bottom surface, and an outer sidewall of the ring-shaped opening during the formation of the semiconductor device, in accordance with some embodiments.

Subsequently, a first bottom electrode layer 117 is conformally deposited over the structure of FIG. 10, as shown in FIG. 12 in accordance with some embodiments. In some embodiments, the first bottom electrode layer 117 is formed lining the ring-shaped opening 114 and over a top surface TS4 of the energy removable layer 107. In some embodiments, the first bottom electrode layer 117 is formed along the inner sidewall SW3, the bottom surface BS2, and the outer sidewall SW4 of the ring-shaped opening 114. The respective step is illustrated as the step S17 in the method 10 shown in FIG. 3.

In some embodiments, the first bottom electrode layer 117 includes titanium nitride (TiN). In some embodiments, the first bottom electrode layer 117 is formed by a deposition process, such as a CVD process, a PVD process, an ALD process, a sputtering process, another suitable method, or a combination thereof.

Figure 13:
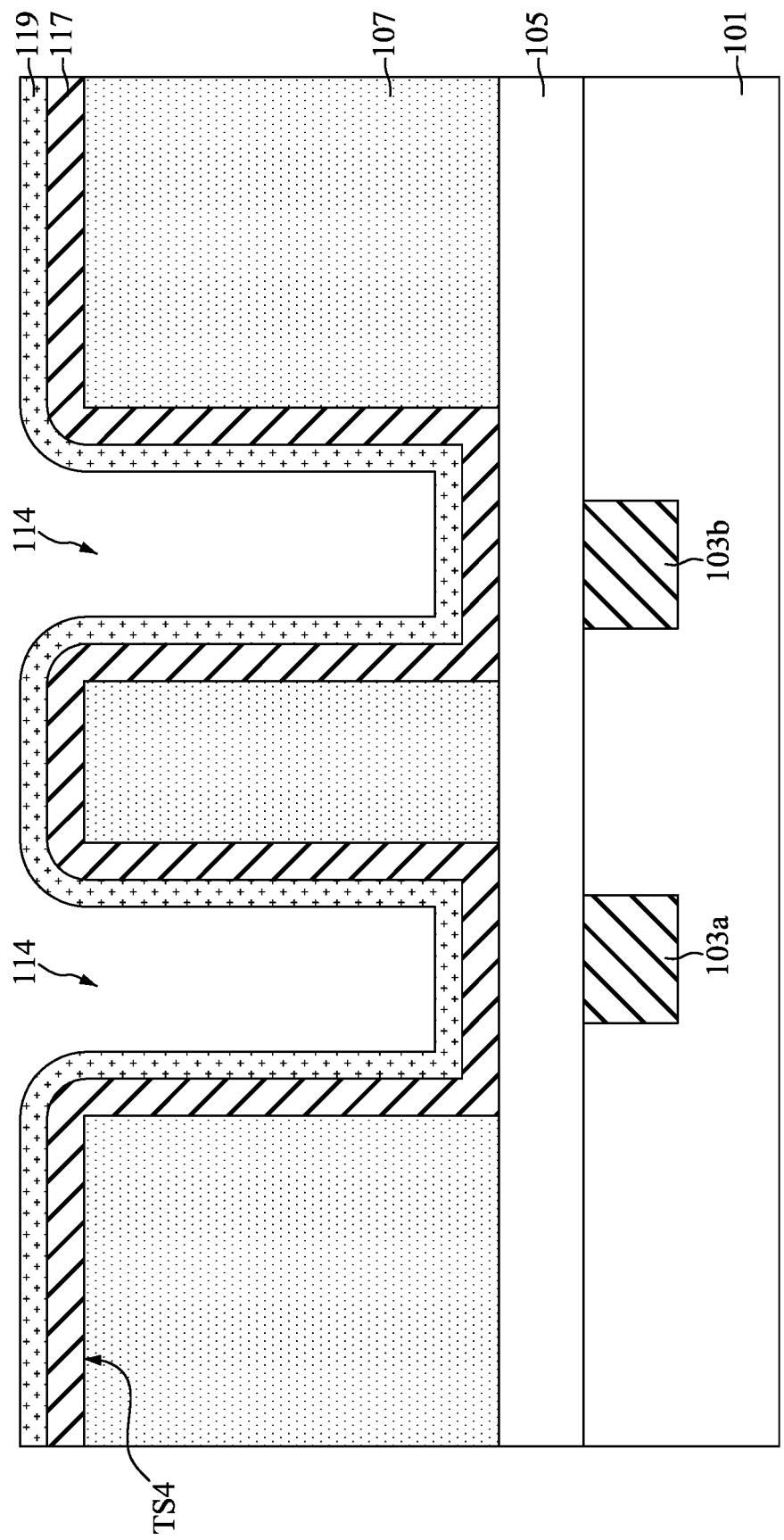
FIG. 13 is a cross-sectional view illustrating an intermediate stage of depositing an insulating layer over the first bottom electrode layer during the formation of the semiconductor device, in accordance with some embodiments.

Then, an insulating layer 119 is conformally deposited over the structure of FIG. 12, as shown in FIG. 13 in accordance with some embodiments. In some embodiments, the first bottom electrode layer 117 is covered by the insulating layer 119. The respective step is illustrated as the step S19 in the method 10 shown in FIG. 3.

In some embodiments, the insulating layer 119 includes a dielectric material, such as silicon dioxide (SiO$_2$), hafnium dioxide (HfO$_2$), aluminum oxide (Al$_2$O$_3$), zirconium dioxide (ZrO$_2$), or a combination thereof. In some embodiments, the insulating layer 119 is formed by a deposition process, such as a CVD process, a PVD process, an ALD process, a spin-on coating process, another suitable method, or a combination thereof. After the insulating layer 119 is formed, a portion of the ring-shaped opening 114 remains unfilled.

Figure 14:
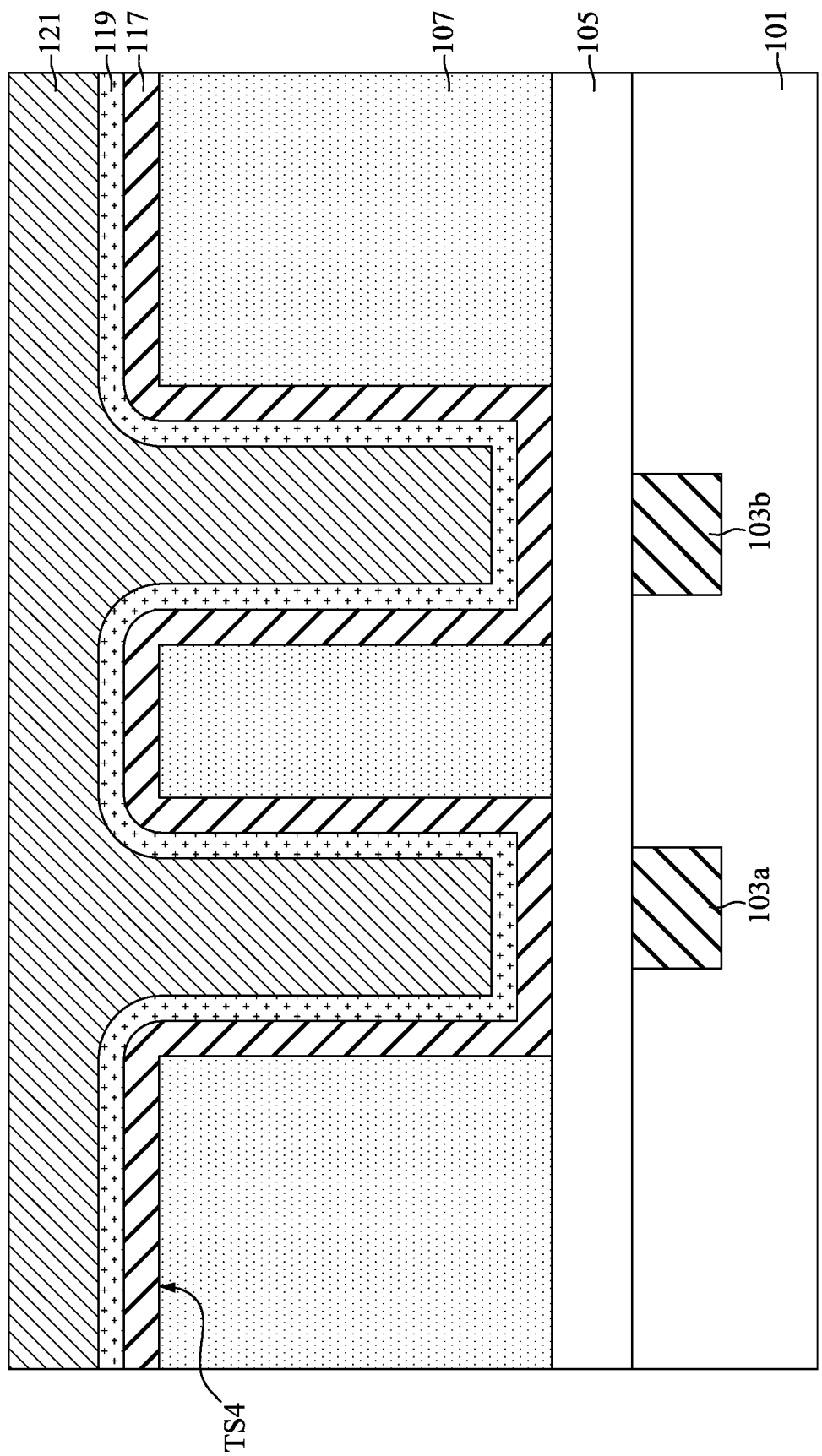
FIG. 14 is a cross-sectional view illustrating an intermediate stage of depositing a top electrode material over the insulating layer during the formation of the semiconductor device, in accordance with some embodiments.

Next, a top electrode material 121 is deposited over the insulating layer 119, as shown in FIG. 14 in accordance with some embodiments. In some embodiments, the remaining portion of the ring-shaped opening 114 is filled by the top electrode material 121, and a portion of the top electrode material 121 extends over the top surface TS4 of the energy removable layer 107. In some embodiments, the top electrode material 121 includes titanium nitride (TiN), silicon germanium (SiGe), or a combination thereof. In some embodiments, the top electrode material 121 is formed by a deposition process, such as a CVD process, a PVD process, an ALD process, a sputtering process, another suitable method, or a combination thereof.

Figure 15:
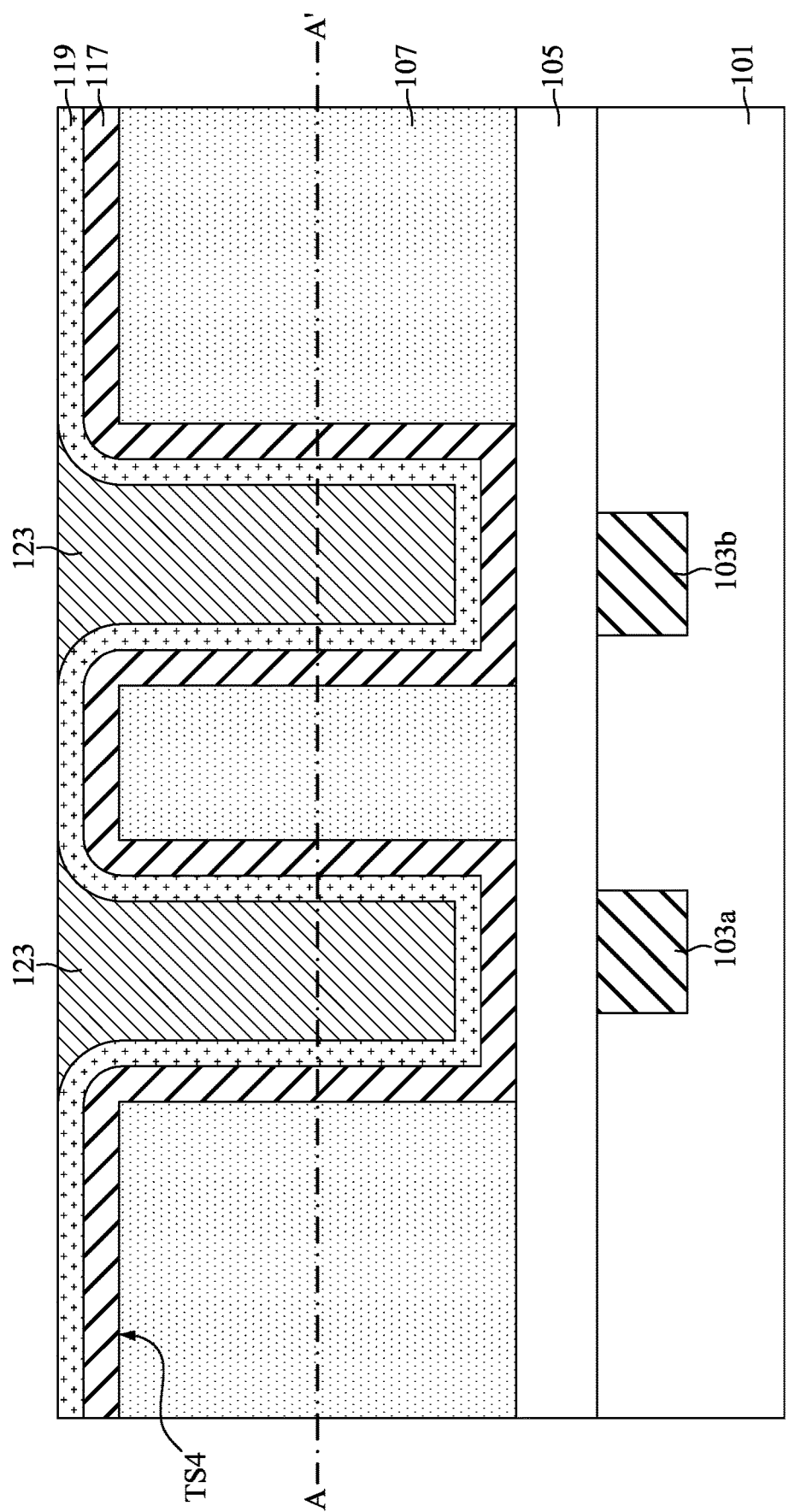
FIG. 15 is a cross-sectional view illustrating an intermediate stage of performing a planarization process on the top electrode material to form a top electrode during the formation of the semiconductor device, in accordance with some embodiments.
Figure 16:
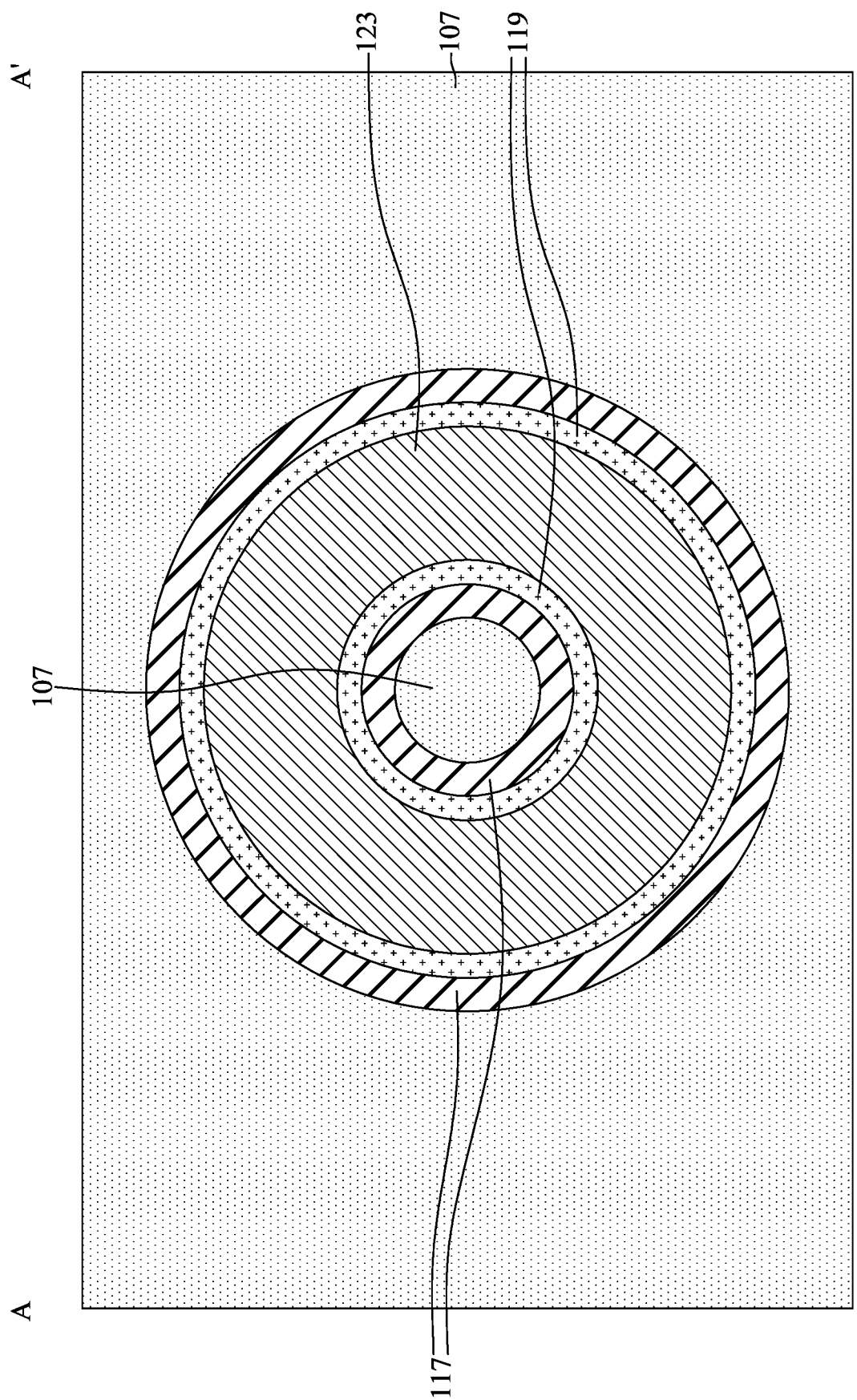
FIG. 16 is a cross-sectional view taken along line A-A' in FIG. 15, in accordance with some embodiments.

Subsequently, a planarization process is performed on the top electrode material 121 to remove excess portions of the top electrode material 121 over the top surface TS4 of the energy removable layer 107, as shown in FIGS. 15 and 16 in accordance with some embodiments. In some embodiments, the planarization process is performed until the insulating layer 119 is exposed. The planarization process may include a CMP process.

After the planarization process is performed, a top electrode 123 is obtained. Since the remaining portion of the ring-shaped opening 114 is filled by the top electrode 123, the top electrode 123 has a ring shape from a top view. The respective step is illustrated as the step S21 in the method 10 shown in FIG. 3.

Figure 17:
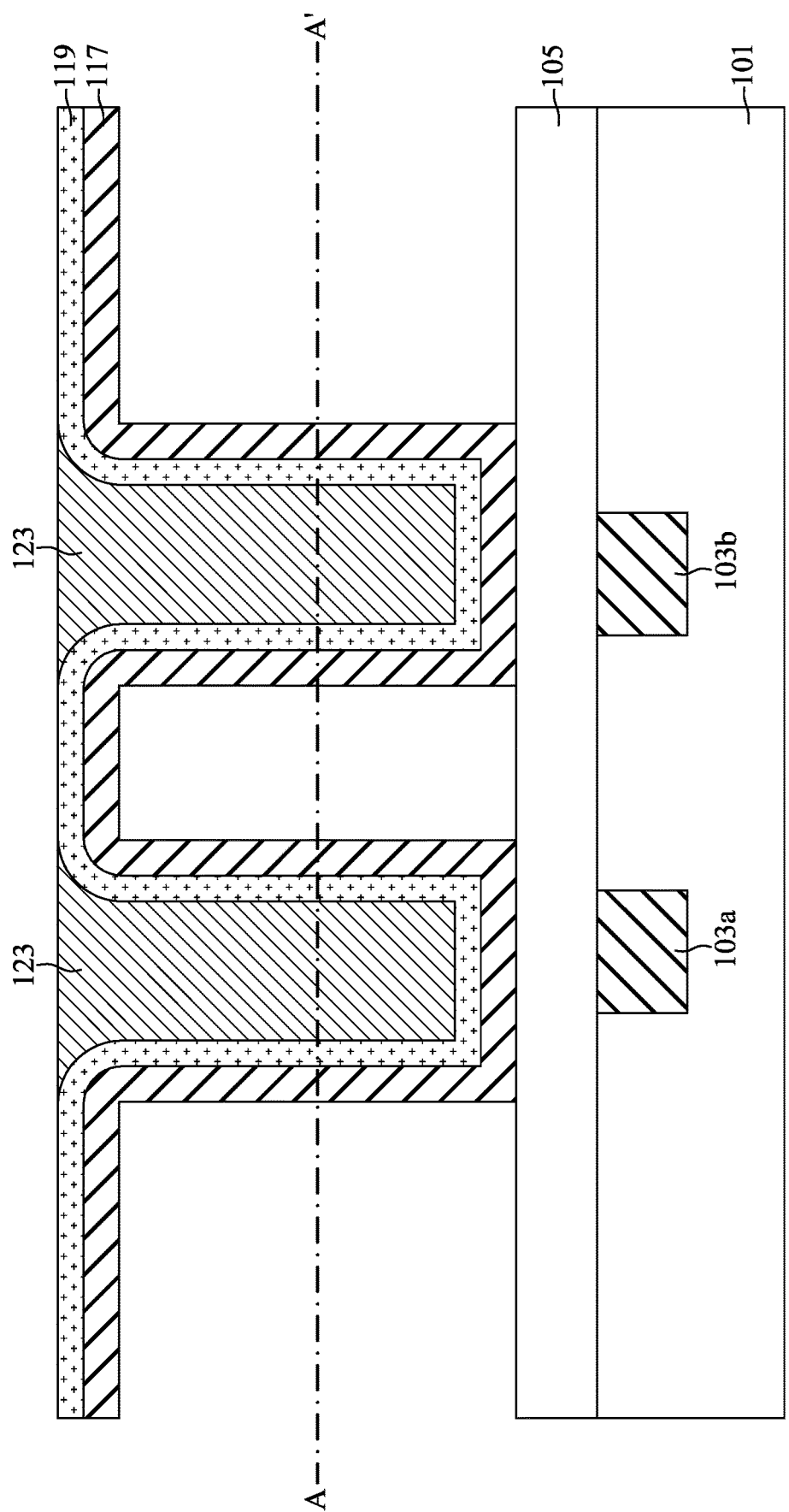
FIG. 17 is a cross-sectional view illustrating an intermediate stage of removing the energy removable layer during the formation of the semiconductor device, in accordance with some embodiments.
Figure 18:
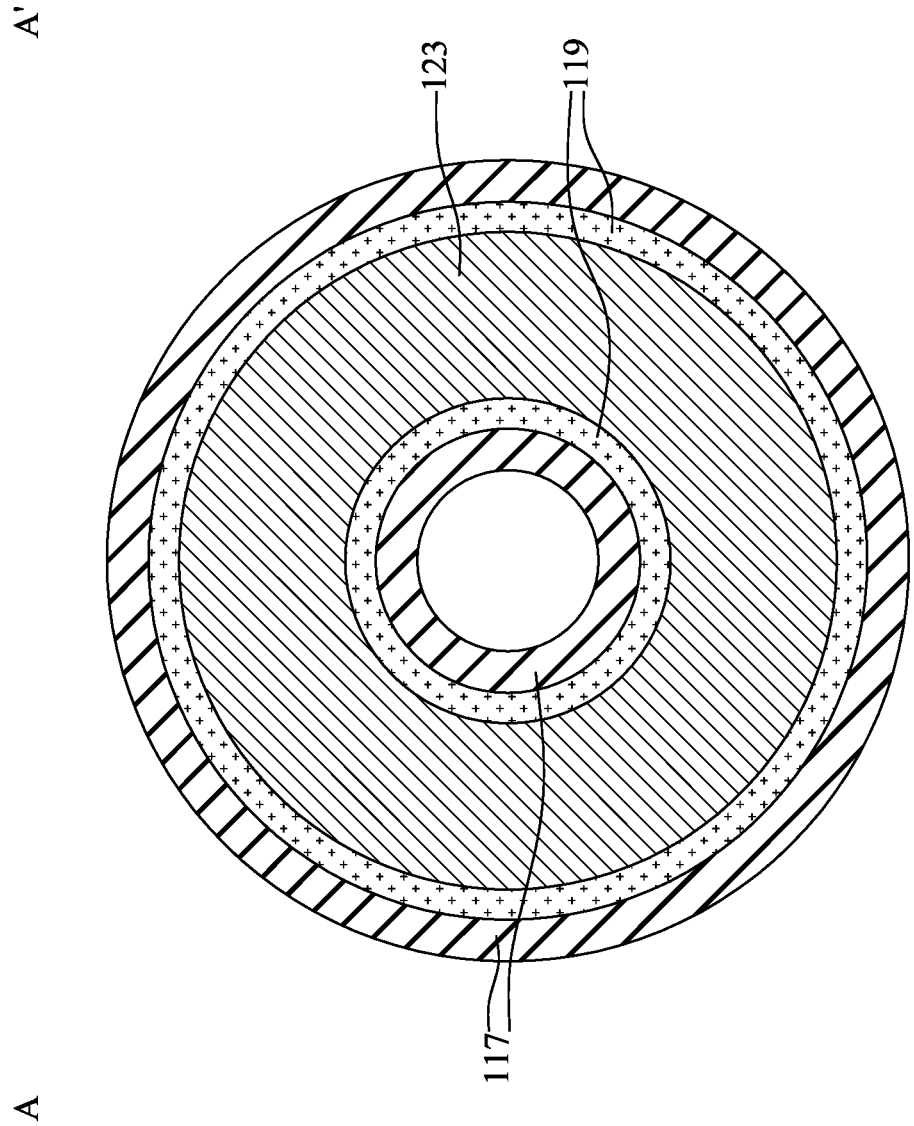
FIG. 18 is a cross-sectional view taken along line A-A' in FIG. 17, in accordance with some embodiments.

Then, the energy removable layer 107 is removed, as shown in FIGS. 17 and 18 in accordance with some embodiments. The respective step is illustrated as the step S23 in the method 10 shown in FIG. 3. In some embodiments, the energy removable layer 107 is removed by a heat treatment process. In some embodiments, the temperature used in the heat treatment process may be high enough to efficiently burn-out the energy removable layer 107.

In some embodiments, after the energy removable layer 107 is removed, the top electrode 123, the insulating layer 119, and the first bottom electrode layer 117 collectively form a pillar-like structure, and the structural strength of the pillar-like structure is high enough to prevent the structure from collapsing. As a result, the yield rate of the semiconductor device may be increased.

Figure 19:
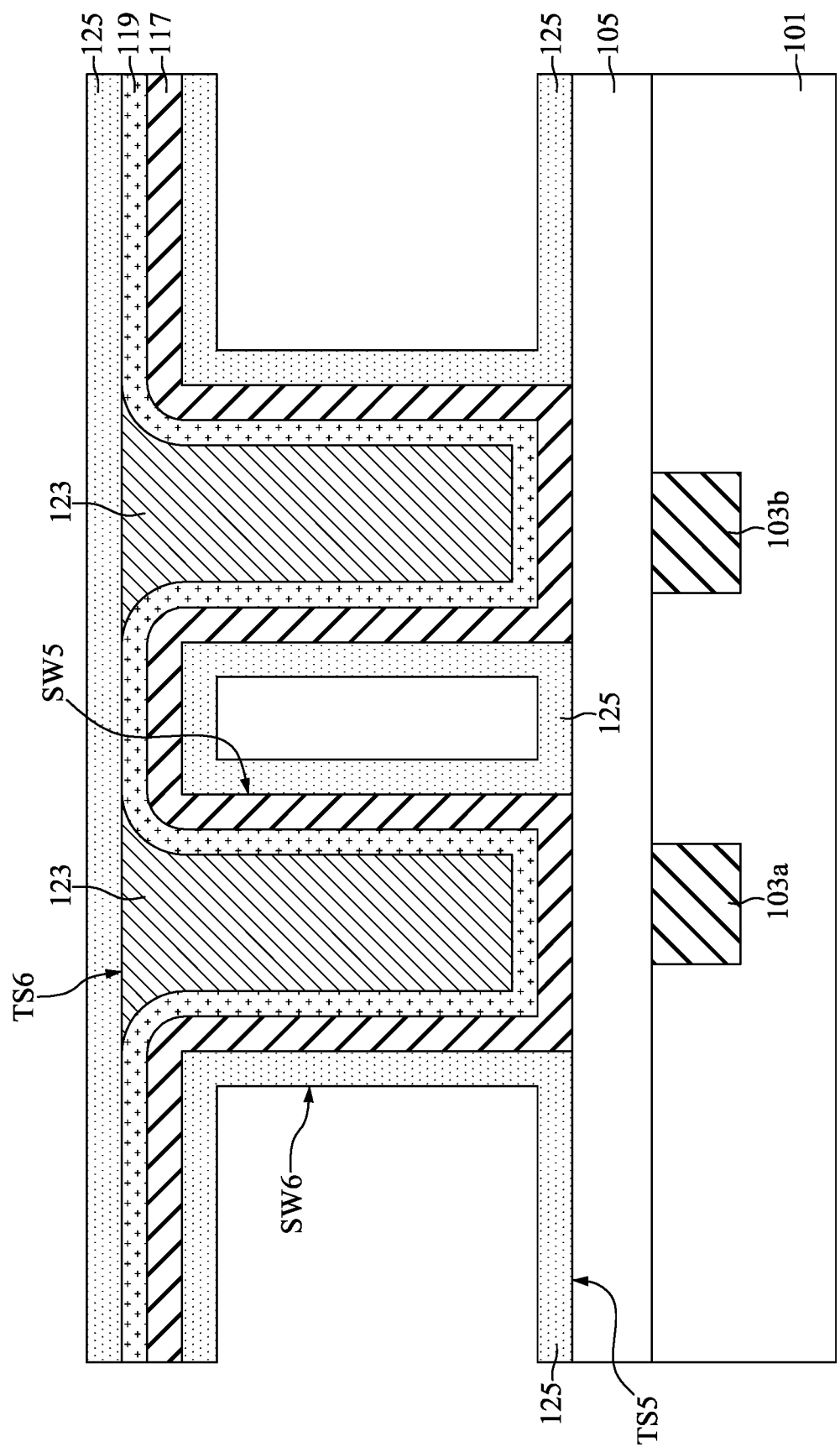
FIG. 19 is a cross-sectional view illustrating an intermediate stage of conformally depositing an insulating material during the formation of the semiconductor device, in accordance with some embodiments.

Next, an insulating material 125 is formed conformally wrapping the surfaces of the structure of FIG. 17, as shown in FIG. 19 in accordance with some embodiments. In some embodiments, the exposed surfaces of the dielectric layer 105, the first bottom electrode layer 117, the insulating layer 119, and the top electrode 123 are covered by the insulating material 125. In some embodiments, the top surface TS5 of the dielectric layer 105, the sidewalls SW5 and SW6 of the first bottom electrode layer 117, and the top surface TS6 of the top electrode 123 are covered by the insulating material 125.

In some embodiments, the insulating material 125 includes a dielectric material, such as silicon dioxide (SiO$_2$), hafnium dioxide (HfO$_2$), aluminum oxide (Al$_2$O$_3$), zirconium dioxide (ZrO$_2$), or a combination thereof. In some embodiments, the insulating material 125 and the insulating layer 119 include different materials so that the etching selectivities may be different in the subsequent etching process.

Figure 20:
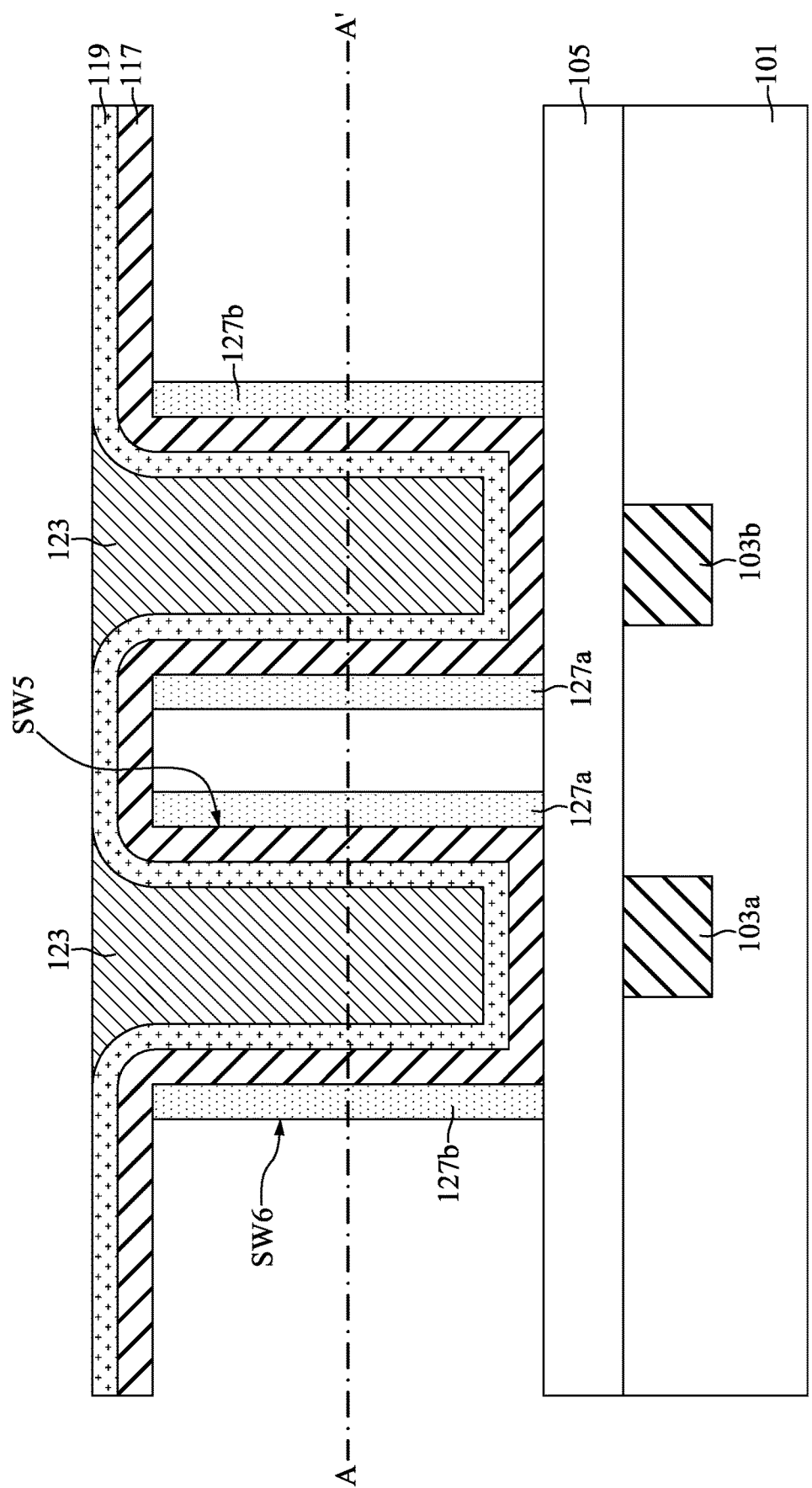
FIG. 20 is a cross-sectional view illustrating an intermediate stage of performing an etch-back process on the insulating material to form insulating portions during the formation of the semiconductor device, in accordance with some embodiments.
Figure 21:
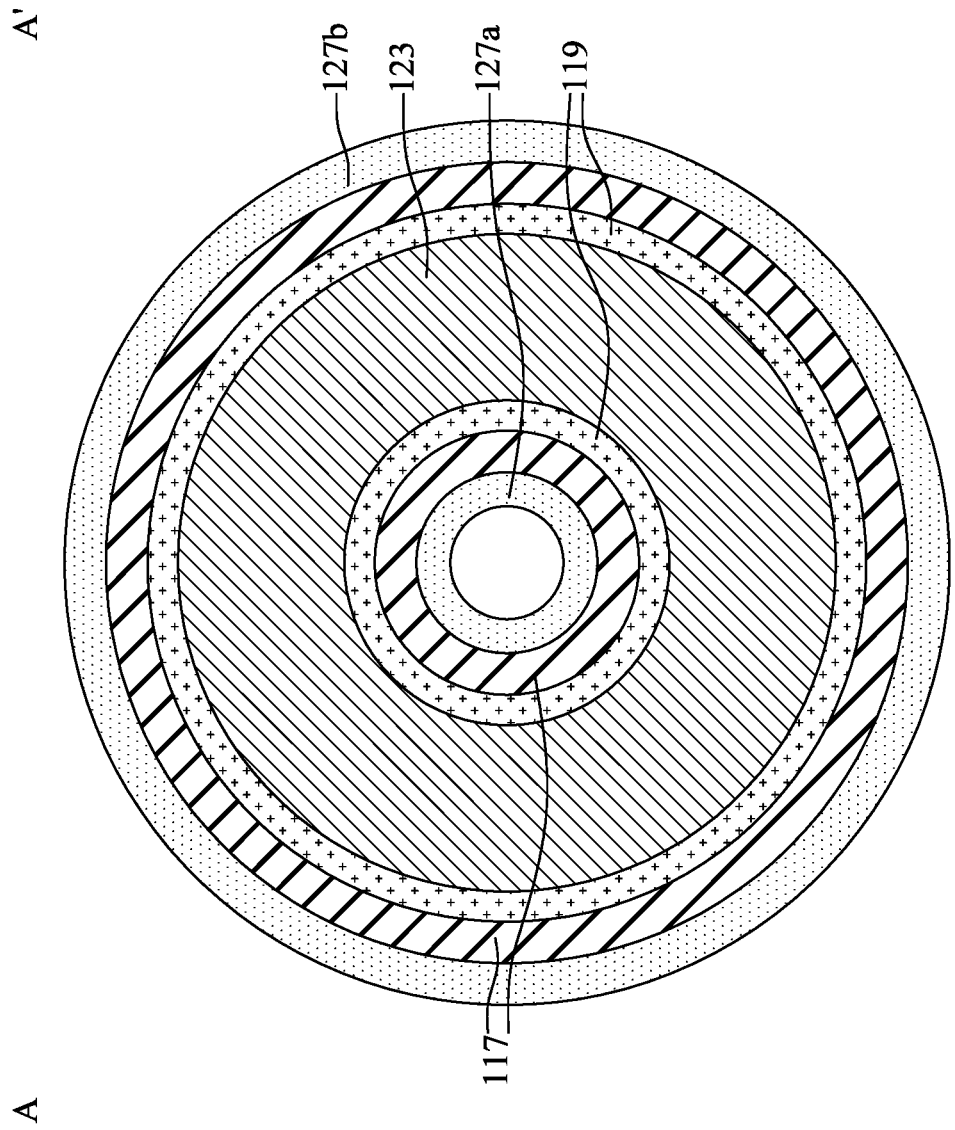
FIG. 21 is a cross-sectional view taken along line A-A' in FIG. in accordance with some embodiments.

Subsequently, an etch-back process is performed on the insulating material 125 such that a plurality of insulating portions 127a and 127b remain on the sidewalls SW5 and SW6 of the first bottom electrode layer 117, as shown in FIGS. 20 and 21 in accordance with some embodiments. The respective step is illustrated as the step S25 in the method 10 shown in FIG. 3. In some embodiments, the inner insulating portion 127a remains on and in direct contact with the sidewall SW5 of the first bottom electrode layer 117, and the outer insulating portion 127b remains on and in direct contact with the sidewall SW6 of the first bottom electrode layer 117. The etch-back process may include a wet etching process, a dry etching process, or a combination thereof.

After the insulating portions 127a and 127b are formed, a second bottom electrode layer 129 is formed surrounding the first bottom electrode layer 117 and covering the insulating portions 127a and 127b, as shown in FIGS. 1 and 2 in accordance with some embodiments. The respective step is illustrated as the step S27 in the method 10 shown in FIG. 3. In some embodiments, the second bottom electrode layer 129 includes an inner portion 129a and an outer portion 129b.

In some embodiments, the second bottom electrode layer 129 includes silicon germanium (SiGe). In some embodiments, the second bottom electrode layer 129 is formed by a deposition process, such as a CVD process, a PVD process, an ALD process, a sputtering process, another suitable method, or a combination thereof. In some embodiments, the inner portion 129a of the second bottom electrode layer 129 is surrounded by and in direct contact with the inner insulating portion 127a, and the outer insulating portion 127b is surrounded by and in direct contact with the outer portion 129b of the second bottom electrode layer 129.

In some embodiments, the second bottom electrode layer 129 is disposed between the dielectric layer 105 and the first bottom electrode layer 117. In some embodiments, the first bottom electrode layer 117 and the second bottom electrode layer 129 collectively form a bottom electrode structure 131. After the second bottom electrode layer 129 is formed, the semiconductor device 100 is obtained.

In some embodiments, the first bottom electrode layer 117 and the second bottom electrode layer 129 are laterally separated by the inner insulating portion 127a and the outer insulating portion 127b, thereby increasing the surface area of the electrode plates, and hence, the effective capacitance can be obtained. As a result, the overall device performance may be improved, and the yield rate of the semiconductor device may be increased.

Embodiments of a semiconductor device and method for preparing the same are provided in the disclosure. In some embodiments, the semiconductor device includes a bottom electrode structure (e.g., the bottom electrode structure 131), a top electrode (e.g., the top electrode 123) disposed over the bottom electrode structure, and an insulating layer (e.g., the insulating layer 119) separating the top electrode from the bottom electrode structure. In some embodiments, the bottom electrode structure includes a first bottom electrode layer (e.g., the first bottom electrode layer 117) and a second bottom electrode layer (e.g., the second bottom electrode layer 129) surrounding the first bottom electrode layer. The top electrode has a ring shape, and the top electrode is surrounded by the first bottom electrode layer.

Before the second bottom electrode layer is formed, the top electrode, the insulating layer and the first bottom electrode layer collectively form a pillar-like structure (e.g., the structure over the dielectric layer 105 shown in FIG. 17) for enhancing structural strength, which makes the structure not likely to collapse. In addition, the first bottom electrode layer and the second bottom electrode layer are laterally separated by a plurality of insulating portions (e.g., the inner insulating portion 127a and the outer insulating portion 127b), thereby increasing the surface area of the electrode plates, and hence, the effective capacitance can be obtained. As a result, the overall device performance may be improved, and the yield rate of the semiconductor device may be increased.

In one embodiment of the present disclosure, a semiconductor device is provided. The semiconductor device includes a bottom electrode structure disposed over a semiconductor substrate. The bottom electrode structure includes a first bottom electrode layer, and a second bottom electrode layer surrounding the first bottom electrode layer. The semiconductor device also includes a plurality of insulating portions laterally separating the first bottom electrode layer and the second first bottom electrode layer. The semiconductor device further includes a top electrode disposed over and surrounded by the bottom electrode structure. The top electrode has a ring shape from a top view. In addition, the semiconductor device includes an insulating layer separating the top electrode from the bottom electrode structure.

In another embodiment of the present disclosure, a semiconductor device is provided. The semiconductor device includes a top electrode disposed over a semiconductor substrate. The top electrode has a ring shape from a top view. The semiconductor device also includes an insulating layer disposed along an inner sidewall, a bottom surface, and an outer sidewall of the top electrode, and a bottom electrode structure surrounding the insulating layer. The bottom electrode structure includes a first bottom electrode layer directly contacting the insulating layer, and a second bottom electrode layer surrounding the first bottom electrode layer. The semiconductor device further includes a plurality of insulating portions disposed between the first bottom electrode layer and the second bottom electrode layer.

In yet another embodiment of the present disclosure, a method for preparing a semiconductor device is provided. The method includes forming a dielectric layer over a semiconductor substrate, and forming an energy removable layer over the dielectric layer. The method also includes etching the energy removable layer to form a ring-shaped opening exposing the dielectric layer, and depositing a first bottom electrode layer along an inner sidewall, a bottom surface, and an outer sidewall of the ring-shaped opening. The method further includes depositing an insulating layer over the first bottom electrode layer, and forming a top electrode in a remaining portion of the ring-shaped opening. In addition, the method includes removing the energy removable layer after the top electrode is formed.

The embodiments of the present disclosure have some advantageous features. In some embodiments, the semiconductor device includes a top electrode having a ring-shape. Since the top electrode, the insulating layer and the first bottom electrode layer collectively form a pillar-like structure before the second bottom electrode layer is formed, the enhanced structural strength makes the structure not likely to collapse. As a result, the overall device performance may be improved, and the yield rate of the semiconductor device may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a bottom electrode structure disposed over a semiconductor substrate, wherein the bottom electrode structure comprises:
a first bottom electrode layer; and
a second bottom electrode layer surrounding the first bottom electrode layer;
a plurality of insulating portions laterally separating the first bottom electrode layer and the second bottom electrode layer;
a top electrode disposed over and surrounded by the bottom electrode structure, wherein the top electrode has a ring shape from a top view;
an insulating layer separating the top electrode from the bottom electrode structure; and
a dielectric layer disposed between the bottom electrode structure and the semiconductor substrate, wherein the first bottom electrode layer and the second bottom electrode layer are in direct contact with the dielectric layer.

2. The semiconductor device of claim 1, wherein the first bottom electrode layer and the second bottom electrode layer include different materials.

3. The semiconductor device of claim 1, wherein the first bottom electrode layer extends over a top surface of the second bottom electrode layer.

4. The semiconductor device of claim 1, wherein the insulating layer extends over a top surface of the second bottom electrode layer.

5. The semiconductor device of claim 1, wherein the insulating portions include an inner insulating portion and an outer insulating portion separating from the inner insulating portion, and the top electrode is disposed between the inner insulating portion and the outer insulating portion.

6. The semiconductor device of claim 5, wherein the inner insulating portion and the outer insulating portion are ring-shaped.

7. A semiconductor device, comprising:
a top electrode disposed over a semiconductor substrate, wherein the top electrode has a ring shape from a top view;

an insulating layer disposed along an inner sidewall, a bottom surface, and an outer sidewall of the top electrode;
a bottom electrode structure surrounding the insulating layer, wherein the bottom electrode structure comprises:
a first bottom electrode layer directly contacting the insulating layer; and
a second bottom electrode layer surrounding the first bottom electrode layer;
a plurality of insulating portions disposed between the first bottom electrode layer and the second bottom electrode layer; and
a dielectric layer disposed between the bottom electrode structure and the semiconductor substrate, wherein the first bottom electrode layer, the second bottom electrode layer and the insulating portions are in direct contact with the dielectric layer.

8. The semiconductor device of claim 7, wherein the first bottom electrode layer extends between the insulating layer and the semiconductor substrate.

9. The semiconductor device of claim 7, wherein the first bottom electrode layer includes titanium nitride (TiN), and the second bottom electrode layer includes polysilicon, silicon germanium (SiGe), or a combination thereof.

10. The semiconductor device of claim 7, wherein the first bottom electrode layer extends over and in direct contact with a top surface of the second bottom electrode layer and top surfaces of the insulating portions.

11. The semiconductor device of claim 7, wherein the insulating layer includes a first insulating material, and the insulating portions include a second insulating material, and
wherein the first insulating material is different from the second insulating material.

* * * * *